United States Patent [19]

Lee

[11] Patent Number: 5,702,969
[45] Date of Patent: Dec. 30, 1997

[54] BURIED BIT LINE DRAM CELLS AND FABRICATING METHODS THEREFOR

[75] Inventor: Kang-yoon Lee, Suwon, Rep. of Korea

[73] Assignee: Samsung Electronics Co., Ltd., Suwon, Rep. of Korea

[21] Appl. No.: 637,223

[22] Filed: Apr. 24, 1996

[30] Foreign Application Priority Data

Apr. 25, 1995 [KR] Rep. of Korea ............ 95-9794

[51] Int. Cl.$^6$ ...................................... H01L 21/70
[52] U.S. Cl. ....................... 437/52; 427/60; 427/203
[58] Field of Search .................... 437/47, 48, 52, 437/60, 203; 257/301

[56] References Cited

U.S. PATENT DOCUMENTS

| | | | |
|---|---|---|---|
| 5,348,905 | 9/1994 | Kenney | 437/52 |
| 5,418,176 | 5/1995 | Yang et al. | 437/52 |
| 5,420,060 | 5/1995 | Gill et al. | 437/52 |
| 5,536,670 | 7/1996 | Hsue | 437/52 |
| 5,618,745 | 4/1997 | Kita | 438/164 |

*Primary Examiner*—John Niebling
*Assistant Examiner*—Joni Y. Chang
*Attorney, Agent, or Firm*—Myers Bigel Sibley & Sajovec, L.L.P.

[57] ABSTRACT

A buried bit line DRAM cell includes an active region having a protruding tap, formed in a semiconductor substrate. A device isolation region is formed in the substrate, outside the active region. A bit line laterally contacts the tap and is buried in the device isolation region. Accordingly, photolithography steps for forming a device isolation film twice and for forming a bit line contact can be omitted, thereby obtaining process simplicity and wider process margins.

12 Claims, 9 Drawing Sheets

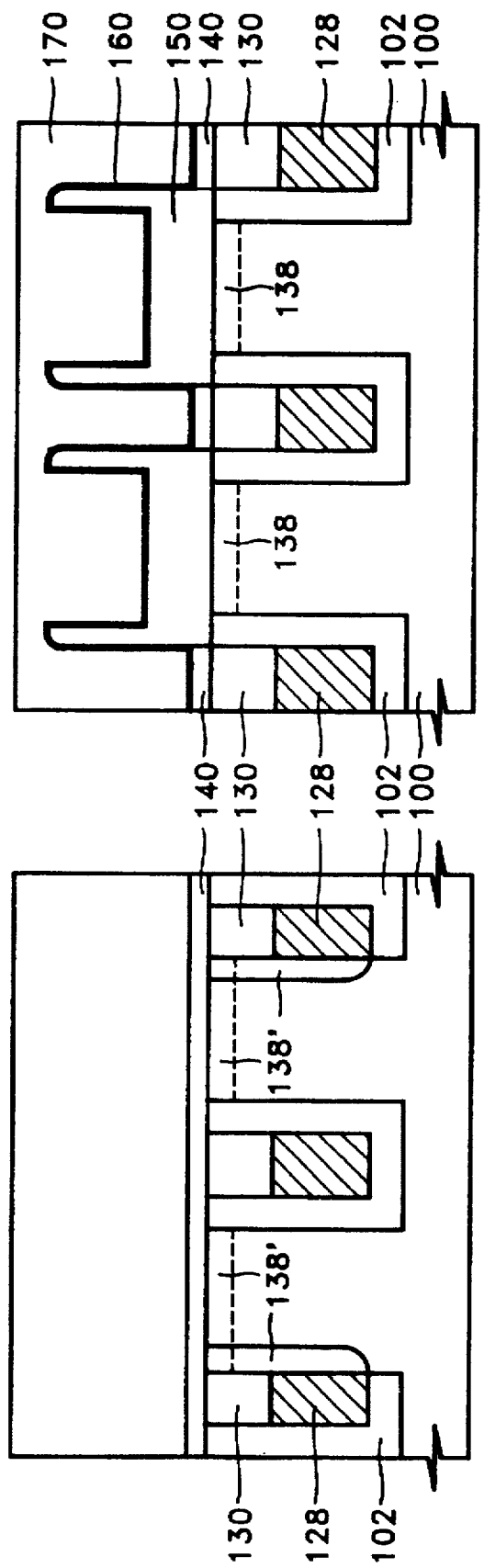

BURIED BIT LINE DRAM CELLS AND FABRICATING METHODS THEREFOR

FIELD OF THE INVENTION

The present invention relates to semiconductor memory devices and fabricating methods therefor, and more particularly to dynamic random access memory (DRAM) cells and fabricating methods therefor.

BACKGROUND OF THE INVENTION

As the integration level of semiconductor memory devices, such as DRAM devices, increases, each cell generally is reduced in size. To provide for such reduction in cell size, various techniques have been used to increase cell capacitance by increasing the effective area of a cell capacitor. To increase the capacitor's effective area, stacked-capacitor and trench-capacitor structures, as well as combinations thereof, have been developed.

However, for these structures to be viable, a field effect transistor, a device isolation region, a bit line contact and a storage node contact must all be formed in a DRAM unit cell. Thus, design rules for minimizing area and ensuring adequate process margin are required. These structures may be very difficult to realize when cell area is very small, for example, 0.5 µm² or below. In a conventional DRAM structure, the bit line is formed on the surface of a substrate, resulting in lower photolithography process margin.

In an effort to circumvent these technological problems, a buried bit line (BBL) cell in which a bit line is buried in the isolation region of a stacked cell, has been suggested. See the publication *"Buried Bit-Line Cell for 64 Mb DRAMs"* by Y. Kohyama et al., '91 Symposium on VLSI Technology, pp. 17–18. This structure includes a bit line which is buried in the device isolation region, and a lateral bit line contact which is formed to achieve maximum area efficiency within a small area.

The above BBL cell will be described by referring to the attached drawings FIGS. 1, 2 and 3A–3E. FIG. 1 is a plan view of mask patterns for fabricating a conventional BBL cell. Here, respective mask patterns are shown for defining a first field oxide film denoted by reference numeral 2, a bit line denoted by reference numeral 3, a bit line contact denoted by reference numeral 4, a gate electrode denoted by reference numeral 5, and a storage electrode denoted by reference numeral 6.

FIG. 2 is a vertical section view of FIG. 1 in the X-axis direction. Here, a first field oxide film 2 is formed to define a device isolation region on a semiconductor substrate, and the bit line 3 is buried under the surface of the substrate. The bit line contact 4 for making contact with the drain protrudes laterally from the bit line 3.

FIGS. 3A–3E are vertical section views of FIG. 1 in the Y-axis direction, showing the steps of fabricating the BBL cell structure of FIGS. 1 and 2.

Referring to FIG. 3A, the first field oxide film 2 (FIG. 2) is formed by a general device isolation method, such as a LOCOS method. Then, using a silicon nitride pattern 14 as a mask, trenches are formed in the semiconductor substrate 10, and a second field oxide film 12 is formed along the inner walls of the trenches.

Referring to FIG. 3B, a photoresist 16 is coated on the resultant structure including the second field oxide film 12. Thereafter, the photoresist 16 is patterned, thereby defining an area for forming a lateral bit-line contact therein.

Referring to FIG. 3C, the lateral bit-line contact for making contact between the bit line and the substrate is formed by etching the second field oxide film 12, using the photoresist pattern as an etch mask. A thin polysilicon layer 17 is formed by depositing polysilicon on the surface of the resultant structure, including the lateral bit-line contact. Arsenic ions are then implanted into the substrate 10, thereby forming a source/drain 18.

Referring to FIG. 3D, bit lines 20 are formed by depositing a bit line material such as polysilicon or a refractory metal silicide on the surface of the resultant structure and etching back the resultant structure. The polysilicon layer 17 (see FIG. 3) formed on the silicon nitride pattern 14 is removed.

Referring to FIG. 3E, a third field oxide film 22 is formed on the substrate 10 having the bit lines 20 formed therein, and the silicon nitride pattern 14 (see FIG. 3D) is removed. Thereafter, the gate electrode of the field effect transistor and a capacitor are formed by conventional methods.

According to the above BBL cell structure, step coverage is improved by burying the bit line in the device isolation region of the cell, thereby facilitating the formation of fine patterns. Consequently, the DRAM cell area can be reduced.

In the above-described conventional BBL cell structure, however, it may be necessary to perform a device isolation process twice: once for forming a trench device isolation region having a buried bit line, and once for forming a device isolation region through which the gate runs. Also, photolithography may need to be performed twice for forming the bit line and the bit-line contact, respectively. Accordingly, the manufacturing process may become complex.

SUMMARY OF THE INVENTION

It is therefore an object of the present invention to provide improved buried bit line DRAM cells and fabricating methods therefor.

It is another object of the present invention to provide buried bit line DRAM cells which are compact.

It is yet another object of the present invention to provide fabrication methods for buried bit line DRAM cells which do not require complex process steps and alignments.

These and other objects are provided according to the present invention by integrated circuit dynamic random access memory (DRAM) cells in which a buried bit line is located in a device isolation region and projects through the device isolation region to contact a protruding tap in a buried active region. In particular, DRAM cells according to the present invention include a substrate and a device region in the substrate. The device region includes a protruding tap extending therefrom and also includes a DRAM field effect transistor therein. A device isolation region is also included in the substrate, outside the device region. A buried bit line is located in the device isolation region.

The buried bit line projects through the device isolation region to electrically contact the tap, to thereby electrically connect the bit line to the DRAM cell field effect transistor. Preferably, the active region extends along the substrate in a first direction and the buried bit line also extends along the substrate in the first direction. The tap preferably extends from the device region to the bit line in a second direction which is orthogonal to the first direction. Also preferably, the drain region of the DRAM cell field effect transistor is in the tap.

Methods of fabricating an integrated circuit DRAM cell include the steps of forming a DRAM cell device region in a substrate, where the DRAM cell device region includes a protruding tap extending therefrom. A device isolation region is formed in the substrate, outside the DRAM cell device region. A buried bit line is formed in the device isolation region, to project through the device isolation region and electrically contact the tap.

Preferably, a semiconductor substrate is etched to thereby define a DRAM cell active region in the substrate, including a protruding tap extending therefrom, and a trench in the semiconductor substrate which surrounds the DRAM cell active region including the protruding tap. The trench includes a trench sidewall. A device isolation film is formed on the trench sidewall, with the device isolating film exposing the tap. A conductor is formed in the trench, such that the conductor electrically contacts the tap, but is electrically insulated from the DRAM cell active region outside the tap.

In a preferred embodiment of the present invention, a semiconductor substrate is etched, to thereby define a DRAM cell active region in the semiconductor substrate, including a protruding tap extending therefrom and a first trench in the semiconductor substrate which surrounds the DRAM cell active region including the protruding tap. The first trench is filled with insulating material. A second trench is formed in the insulating material, such that the second trench exposes the tap. The second trench is filled with conductive material to thereby form a bit line which electrically contacts the tap. Insulating material is then formed on the bit line.

The step of filling the first trench may be performed by blanket depositing insulating material on the semiconductor substrate including a first trench, and removing the insulating material from the semiconductor substrate outside the first trench. Insulating material removal may be performed by chemical-mechanical polishing. Similarly, the second trench may be filled by blanket depositing conductive material on the semiconductor substrate including the second trench, and removing the conductive material from the semiconductor substrate outside the second trench. Similarly, insulating material may be formed on the bit line by blanket depositing insulating material on the semiconductor substrate including the bit line, and removing the insulating material from the substrate outside the bit line. Ions may be implanted into the tap through the exposed portion of the second trench between the steps of forming a second trench and filling the second trench.

According to the present invention, the bit line is buried in the device isolation film, thereby obviating the need to perform a device isolation process twice. The bit line contact can be self-aligned with the bit line, thereby obviating a photolithography process for forming a bit line contact. Consequently, process simplicity may be obtained.

BRIEF DESCRIPTION OF THE DRAWINGS

FIGS. 5A, 5B and 5C are vertical section views of a BBL DRAM cell according to the present invention, taken along lines X-X', Y-Y' and Z-Z' of FIG. 4, respectively.

DETAILED DESCRIPTION OF PREFERRED EMBODIMENTS

Figure 1:
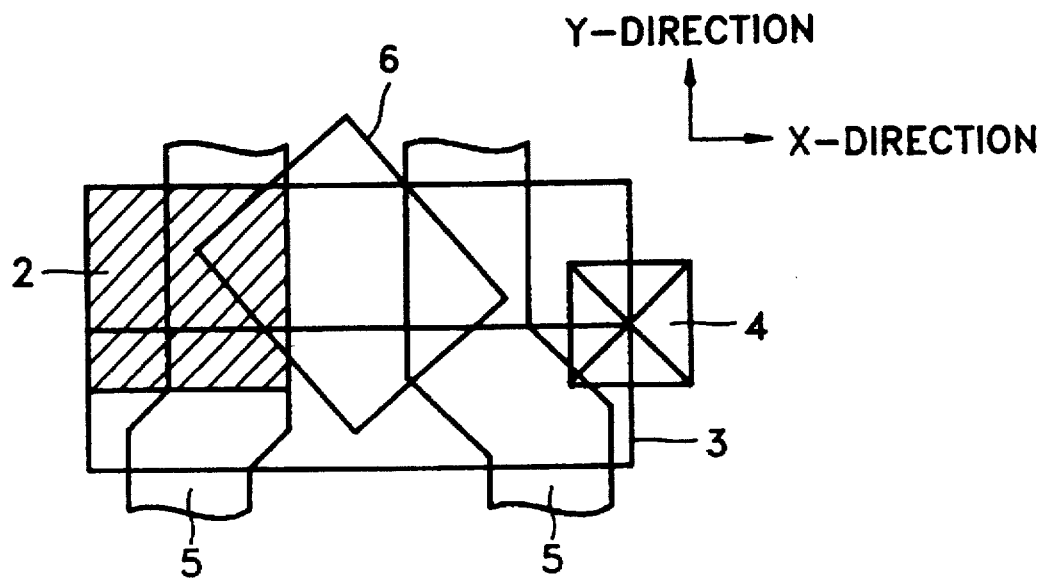
FIG. 1 is a plan view showing mask patterns for manufacturing a conventional BBL DRAM cell.
Figure 2:
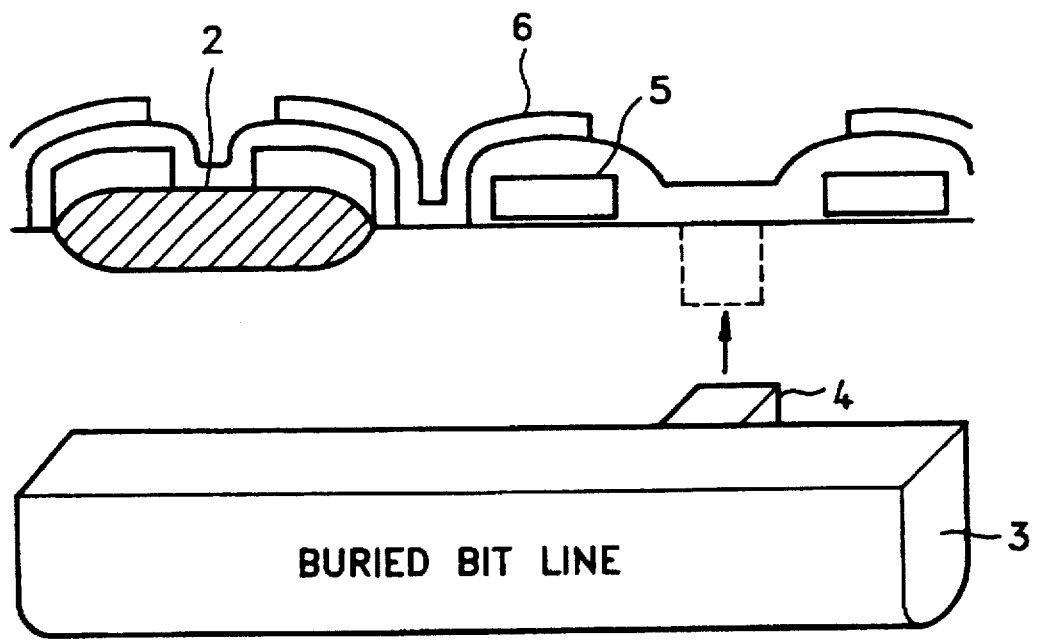
FIG. 2 is a vertical section view of FIG. 1 in the X-axis direction.
Figure 3A:
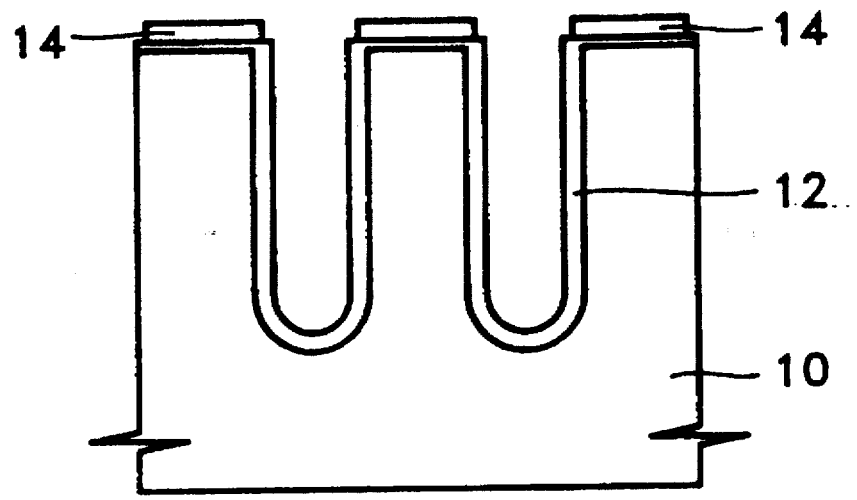
FIGS. 3A–3E are vertical section views of FIG. 1 in the Y-axis direction, for explaining a method for fabricating the conventional BBL DRAM cell.
Figure 3B:
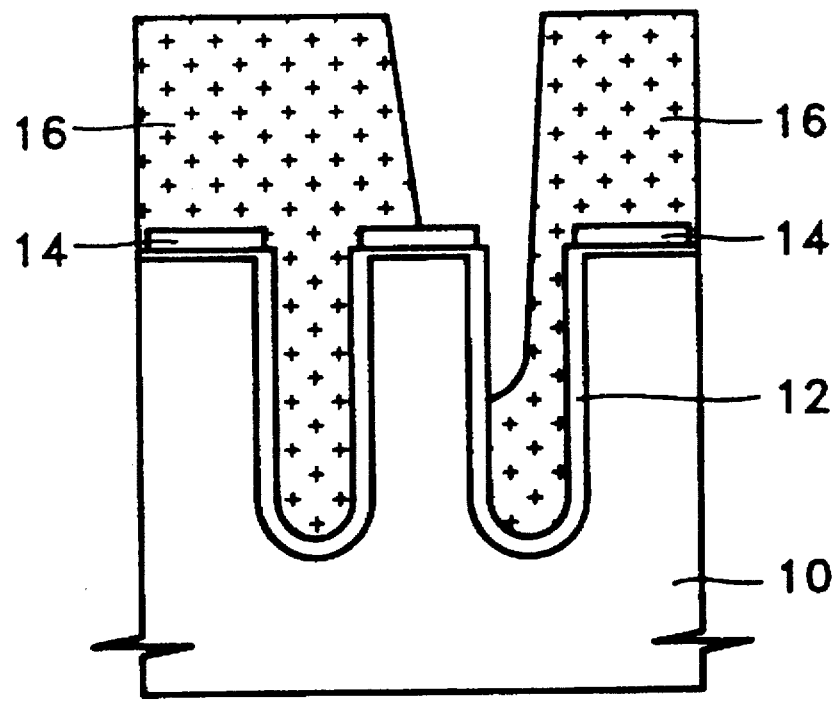
Figure 3C:
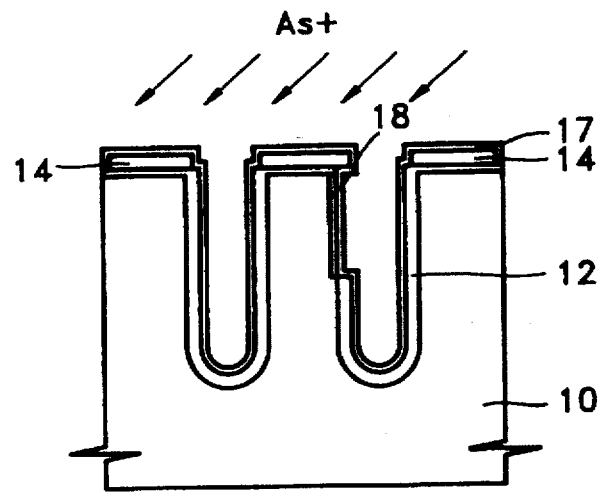
Figure 3D:
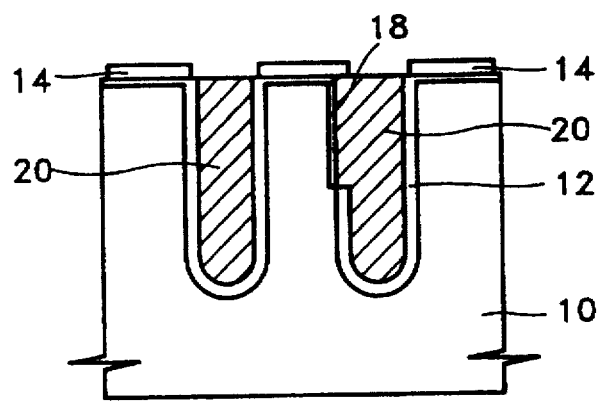
Figure 3E:
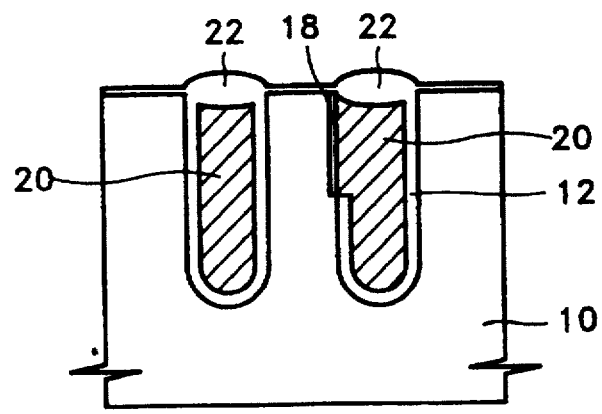

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 4:
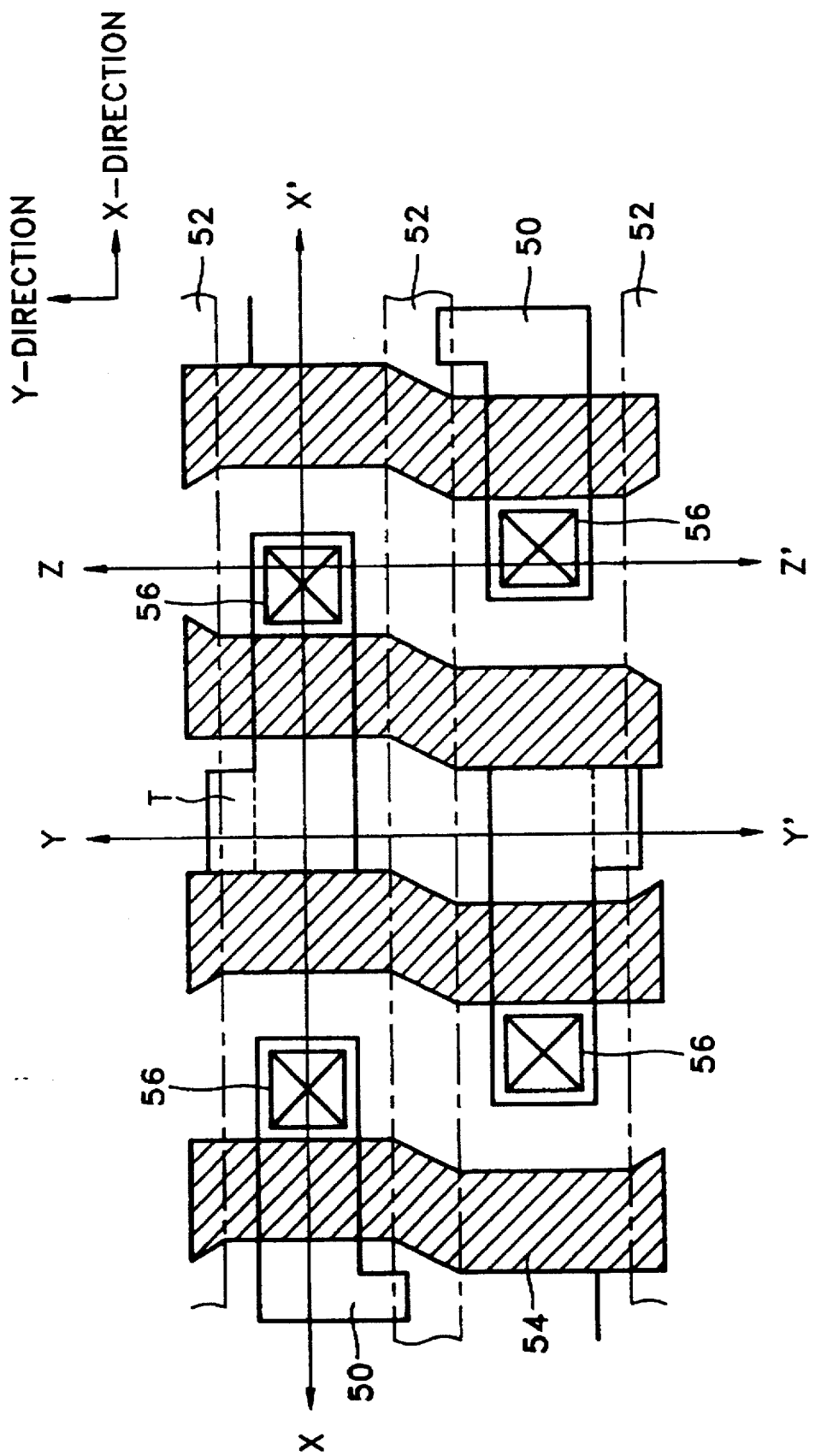
FIG. 4 is a plan view of a BBL DRAM cell according to the present invention.

FIG. 4 is a plan view showing mask patterns used for manufacturing a BBL DRAM cell according to the present invention. Referring to FIG. 4, reference numeral 50 denotes a mask pattern for defining active regions, reference numeral 52 denotes a mask pattern for defining bit lines, reference numeral 54 denotes a mask pattern for defining gate electrodes, and reference numeral 56 denotes a mask pattern for defining storage node contacts.

A DRAM cell field effect transistor is formed in a portion where the mask pattern 50 for defining an active region overlaps with the mask pattern 54 for defining a gate electrode. A source/drain is formed on opposite sides of the portion of overlap. A storage node contact for making contact between a storage electrode and a source is formed in a portion of the source.

According to the above layout, the mask pattern for defining an active region is a rectangle having a protruding tap T, and the remaining portion outside the active region becomes a device isolation region. The protruding tap T overlaps with a portion of the mask pattern 52 for defining a bit line. A bit-line contact for making contact between a bit line and a drain is formed in the overlapped portion.

Figure 5A:
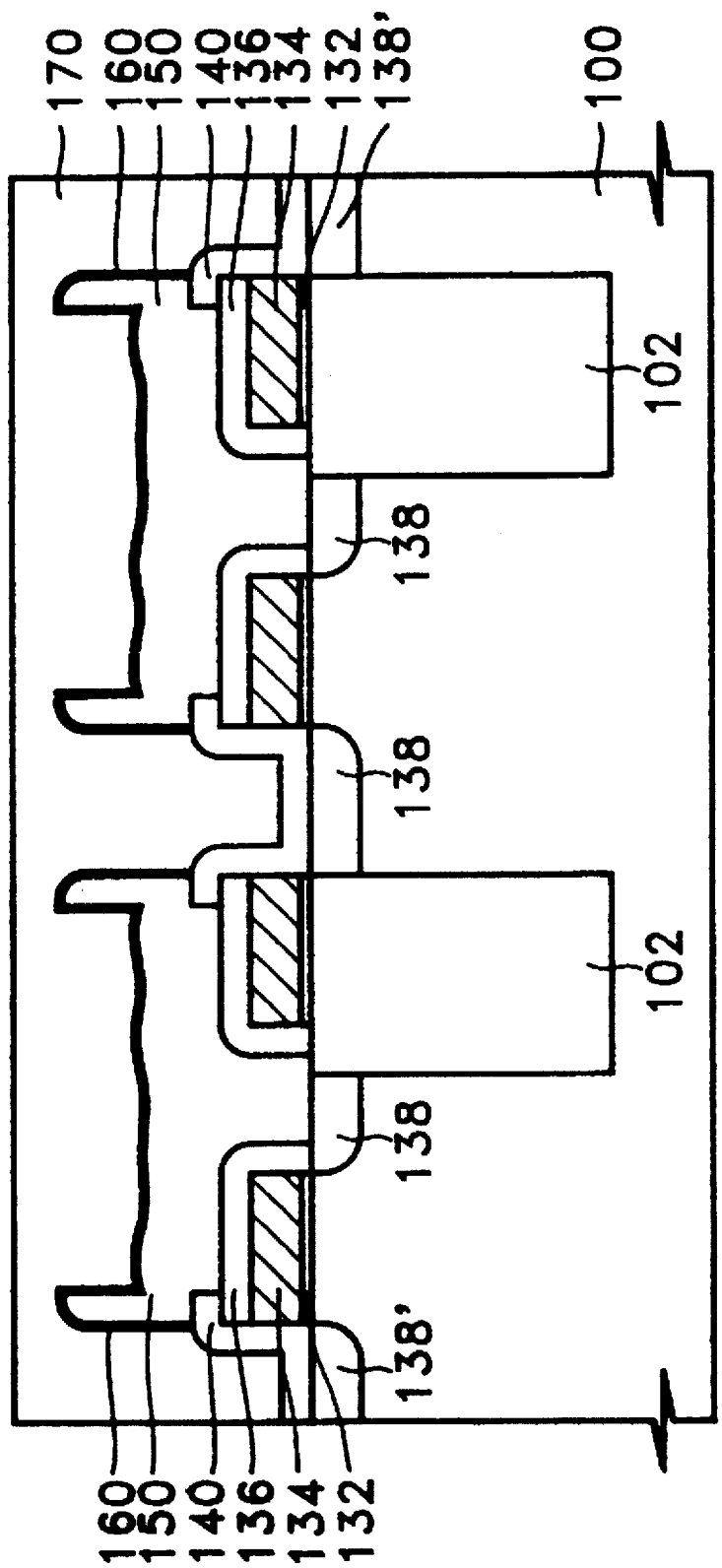

FIG. 5A is a vertical section view of FIG. 4, taken along the X-X' line. In FIG. 5A, reference numeral 100 denotes a semiconductor substrate, reference numeral 102 denotes a device isolation region, reference numeral 132 denotes a gate insulating film, reference numeral 134 denotes the gate of a transistor and reference numerals 136 and 140 denote a first insulating film and a second insulating film, respectively. Reference numerals 138 and 138' denote the source and drain of the transistor, reference numeral 150 denotes the storage electrode of a capacitor, reference numeral 160 denotes the dielectric film of the capacitor, and reference numeral 170 denotes the plate electrode of the capacitor.

FIG. 5B is a vertical section view of FIG. 4 taken along the Y-Y' line, and FIG. 5C is a vertical section view of FIG. 4 taken along the Z-Z' line. Referring to FIGS. 5B and 5C, reference numeral 128 denotes a bit line formed in the device isolation region, and reference numeral 130 denotes an insulating layer for insulating the bit line.

The device isolation film 102 is buried under the surface of the substrate, and the remaining portion inside the device isolation film is an active region. The bit line 128 is buried in the device isolation film 102, and thus is isolated from the semiconductor substrate 100. Insulating layer 130 is formed on the bit line 128, thereby isolating the bit line 128 from conductive layers which are formed on the bit line 128. The device isolation film 102 is removed from a side of the bit line, to thereby expose the tap T and allow formation of a bit-line contact therein. Thus, the bit line 128 directly contacts the drain 138'. The portion where the bit line 128 contacts the drain 138' is an area where the tap T of the mask pattern 40 overlaps with the mask pattern 52 in the layout of FIG. 4.

As shown in the above vertical section views, the bit line 128 is buried in the device isolation film 102 formed under the surface of the semiconductor substrate, and a lateral bit-line contact is formed. Therefore, area is conserved by eliminating the space otherwise required for the bit line contact.

A method for manufacturing a BBL DRAM cell according to an embodiment of the present invention will now be described, with reference to FIGS. 6A–6C through 10A–10C. Here, the "A" drawings correspond to line X-X', the "B" drawings correspond to the Y-Y' line, and the "C" drawings correspond to the Z-Z' line.

A method for manufacturing a BBL DRAM cell according to the present invention may generally include the steps of forming a device isolation film, forming a bit line and a bit line contact, forming a gate, forming a source and a drain, and forming a capacitor.

Figure 6A:
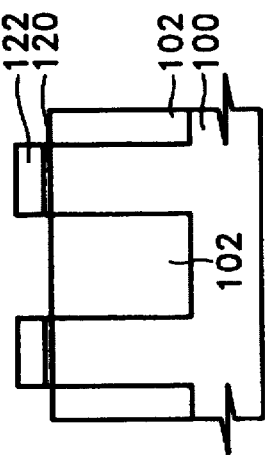
FIGS. 6A–6C through 10A–10C are section views for explaining a method for fabricating a BBL DRAM cell according to the present invention, the "A", "B" and "C" drawings corresponding to lines X-X', Y-Y' and Z-Z' of FIG. 4, respectively.
Figure 6B:
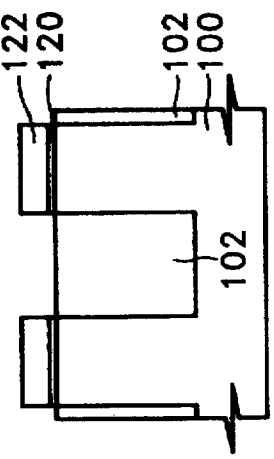
Figure 6C:
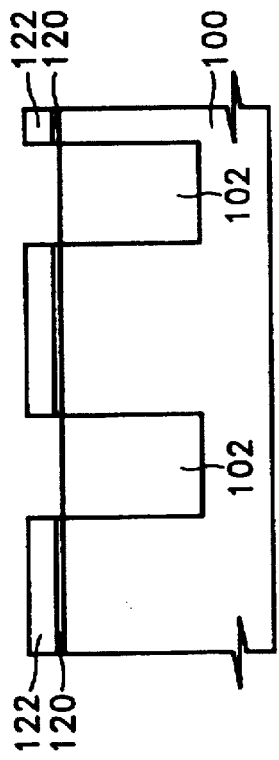

FIGS. 6A, 6B and 6C illustrate a step of forming a device isolation film 102. First, a pad oxide film 120 is formed on semiconductor substrate and a first nitride film 122 is deposited on pad oxide film 120. Then, a first photoresist pattern (not shown) having an opening in a device isolation region is formed on the first nitride film 122. The first nitride film 122 and the pad oxide film 120 are etched to expose the device isolation region of the semiconductor substrate 100, using the first photoresist pattern as an etching mask. A first trench is formed by etching the exposed portion of the semiconductor substrate 100. Thereafter, the first trench is filled with an insulating material, and the surface of the insulating material is planarized by performing a chemical mechanical polishing (CMP) process on the surface of the resultant structure.

The pad oxide film 120 may be formed at a thickness of 100–300 Å by a thermal oxidation method, and the first nitride film 122 may be formed to a thickness of one thousand to several thousand Ångstroms. Preferably, the first photoresist pattern (not shown) is formed by the mask pattern 50 of FIG. 4, and the first trench is formed to a depth of 3,000–5,000 Å. After etching substrate 100 to form the first trench, a thermal oxidation process can also be performed to restore the surface of substrate 100 which is damaged by etching.

To fill the first trench, an oxide film is deposited at a thickness of 6,000–15,000 Å, using a chemical vapor deposition (CVD) method. Then, reactive ion etching or chemical mechanical polishing is performed on the surface of the resultant structure until the surface of first nitride film 122 is exposed, to thereby remove the oxide film from the substrate outside the first trench. A channel-stop ion-implantation can also be performed after etching substrate 100 in order to improve device isolation characteristics.

When the steps of FIGS. 6A, 6B and 6C are completed, the area filled with the insulating material serves as a device isolation region, and the remaining area serves as an active region.

Figure 7A:
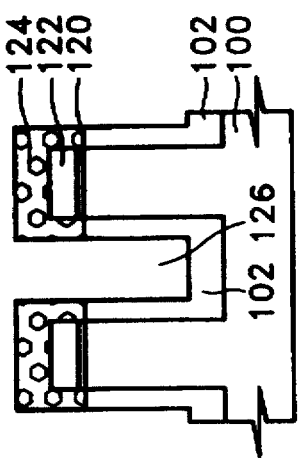
Figure 7B:
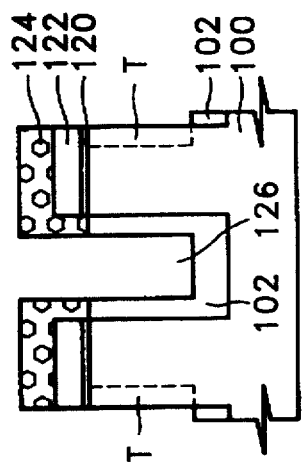
Figure 7C:
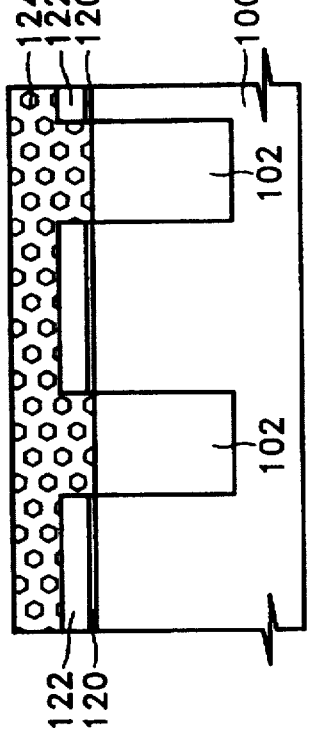

FIGS. 7A, 7B and 7C illustrate a photolithography step for forming a bit line. First, a second photoresist pattern 124 for forming the bit line is formed on the resultant structure having device isolation film 102 formed therein. A second trench 126 is formed by etching device isolation film 102, using second photoresist pattern 124 as an etch mask.

A photoresist is coated on the resultant structure having device isolation film 102 formed therein. Then, second photoresist pattern 124 is formed by patterning the photoresist using mask pattern 52 of FIG. 4. Thereafter, second trench 126 is formed by etching the oxide film filled in the first trench until 500–1,500 Å of the oxide film remains.

As shown in FIG. 7B, the device isolation film 102 does not remain, and the substrate 100 is exposed, in tap portion T. A bit-line contact will be formed in this exposed portion. Second photoresist pattern 124 is removed from the resultant structure.

Figure 8C:
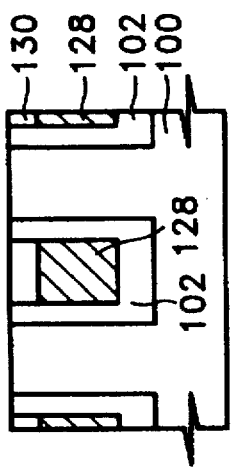
Figure 8B:
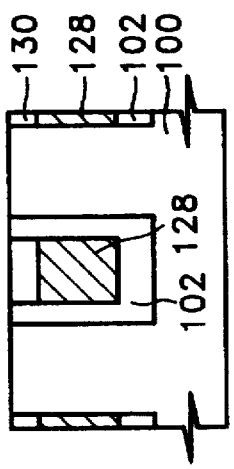
Figure 8A:
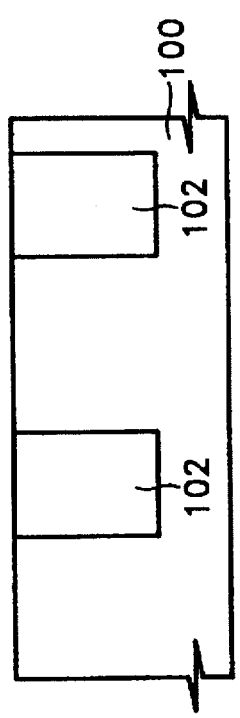

FIGS. 8A, 8B and 8C illustrate the step of forming bit line 128. A bit line material such as polysilicon is deposited on the resultant structure having the second trench formed therein and etched back, thereby forming bit line 128 filling a portion of the second trench. A first insulating layer 130 is formed by depositing an insulating material on the resultant structure having bit line 128 formed therein, and then planarizing the deposited insulating material. Then, the first nitride film 122 (see FIG. 6A) is removed. An impurity implantation for controlling the threshold voltage and forming the well of a transistor may be performed.

For example, polysilicon doped with an impurity is deposited on the resultant structure having the second trench formed therein. The deposited polysilicon is etched back until 1,000–2,000 Å thereof remains, thereby filling a portion of the second trench, and forming a bit line 128.

When a metal or silicide is used as a material for the bit line 128, an impurity generally must be ion-implanted prior to coating of the bit line material in order to form an ohmic bit line contact. However, when doped polysilicon or polycide is used, such ion-implantation is not necessary, as already described.

The bit line contact laterally contacts the active region of the substrate 100 and the bit line 128. The bit line contact is self-aligned with the bit line 128, thereby obviating the need for a photolithography process for forming a bit-line contact.

In addition, the side of the bit line 128, which is free of the bit-line contact, is isolated from the active region by the device isolation film 102. Further, the first insulating film 130 and the device isolation film 102 are formed on and under the bit line 128, respectively, thereby isolating the bit line 128 from the substrate 100. Thus, a buried bit line structure is achieved.

The first nitride film in the active region is removed from the resultant structure having the first insulating film 130 formed therein, and the pad oxide film is etched back. It may be preferred to perform ion-implantation to control the threshold voltage and form the well of transistors on the semiconductor substrate of the active region before removal of the pad oxide film.

Figure 9C:
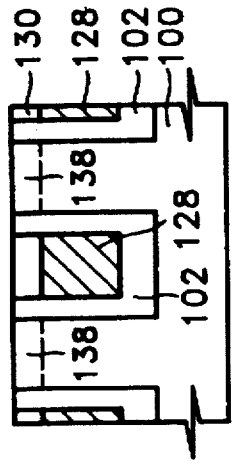
Figure 9B:
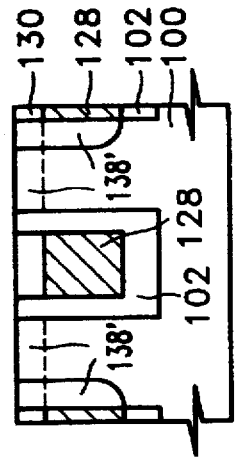
Figure 9A:
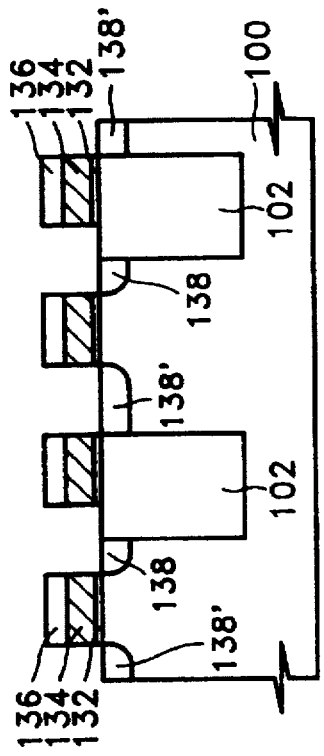

FIGS. 9A, 9B and 9C illustrate the step of forming a gate electrode 134. A gate insulating layer 132 is formed on the structure of FIGS. 8A, 8B and 8C. Then, a gate electrode material 134 is formed on the gate insulating layer 132 and a second insulating layer 136 is formed on the gate electrode material 134. The second insulating film 136, the gate electrode material 134 and the gate insulating layer 132 are sequentially patterned. Thereafter, a source 138 and a drain 138' are formed.

The gate insulating layer 132 is formed of, for example, an oxide film having a thickness of 30–150 Å. Doped polysilicon may be used as a material for forming the gate electrode. Second insulating layer 136 is preferably sufficiently thick so as not to electrically short the storage node and the gate electrode which are formed subsequently and are patterned using the mask pattern 54 of FIG. 4.

Figure 10C:
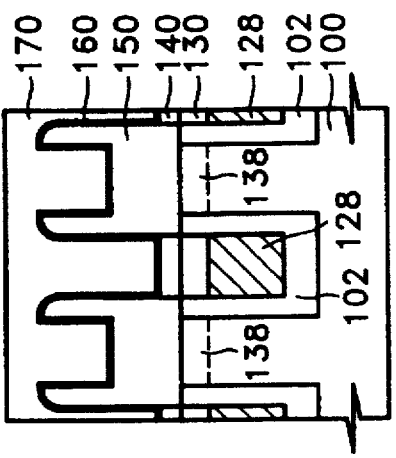
Figure 10B:
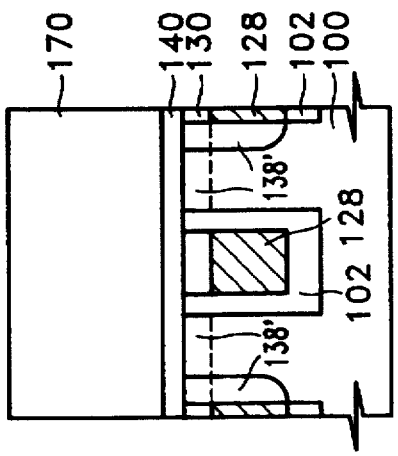
Figure 10A:
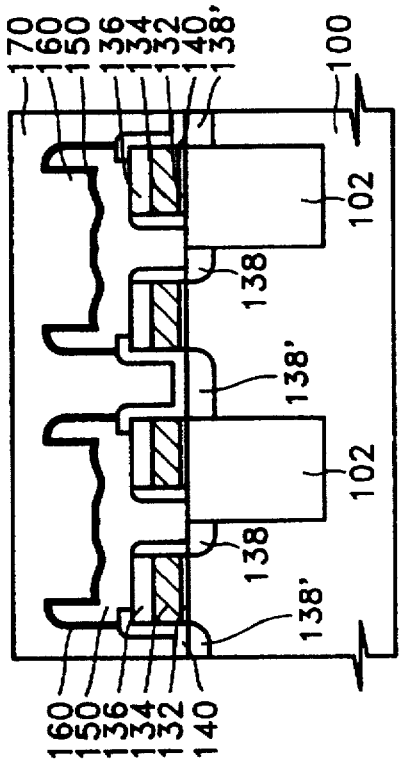

FIGS. 10A, 10B and 10C illustrate the step of forming a third insulating layer 140, storage electrodes 150, dielectric films 160, and plate electrodes 170. First, an insulating material such as silicon dioxide is deposited on the structure having the gate electrode formed therein. Then, a storage contact is formed by partially etching the third insulating layer 140. The storage electrode 150 is formed by depositing a conductive material on the structure. Dielectric film 160 is formed by depositing a high dielectric material on the storage electrode. The plate electrode 170 is formed by depositing a conductive material on the dielectric film 160. The thickness of the third insulating layer 140 is generally determined by the operational characteristics of the transistor, to prevent the flow of electric current between the storage node and the gate electrode, and the size of a storage node contact which will be self-aligned.

The third insulating layer 140 is partially etched using mask pattern 56 of FIG. 4. As a result, the semiconductor substrate 100 is only exposed in the area of the storage node contact. An insulating film is formed on the remaining area. Therefore, the gate electrode can be isolated from the storage node, and the storage node contact can be self-aligned. With variations in the above storage node structure, many different DRAM cells including capacitor structures such as double-stacked, fin, spread-stacked, box, or cylindrical electrodes can be fabricated.

As described above, in the present invention, the device isolation region is formed using a trench. The bit line is buried in a device isolation film formed in the trench. The bit-line contact laterally contacts the bit line and the drain through a removed portion of the device isolation film.

The burial of the bit line in the device isolation film obviates the need to perform a device isolation process twice, and contributes to process simplicity. In addition, since the bit line contact can be self-aligned with the bit line, a separate photolithography step for forming the bit line contact is not required, and adequate process margins can be ensured.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating an integrated circuit dynamic random access memory (DRAM) cell, comprising the steps of:

forming a DRAM cell active region in a substrate, said DRAM cell active region including a protruding tap extending therefrom;

forming a device isolation region in said substrate, outside said DRAM cell active region; and forming a buried bit line in said device isolation region, which projects through said device isolation region to electrically contact said tap.

2. A method according to claim 1 wherein said step of forming a DRAM cell active region comprises the step of forming a DRAM cell active region which extends along said substrate in a first direction and a protruding tap which extends along said substrate in a second direction which is orthogonal to said first direction, and wherein said step of forming a buried bit line comprises the step of forming a buried bit line which extends along said substrate in said first direction.

3. A method of fabricating an integrated circuit dynamic random access memory (DRAM) cell, comprising the steps of:

etching a semiconductor substrate to thereby define a DRAM cell active region in said substrate, including a protruding tap extending therefrom, and a trench in said semiconductor substrate which surrounds said DRAM cell active region including said protruding tap, said trench including a trench sidewall;

forming a device isolation film on said trench sidewall, said device isolation film exposing said tap; and forming a conductor in said trench, such that said conductor electrically contacts said tap but is electrically insulated from said DRAM cell active region outside said tap.

4. A method according to claim 3 wherein said etching step comprises the step of etching a semiconductor substrate to thereby define a DRAM cell active device region which extends along said substrate in a first direction and a protruding tap which extends along said substrate in a second direction which is orthogonal to said first direction, and wherein said step of forming a conductor comprises the step of forming a conductor in said trench which extends along said substrate in said first direction.

5. A method of fabricating an integrated circuit dynamic random access memory (DRAM) cell, comprising the steps of:

etching a semiconductor substrate to thereby define a DRAM cell active region in said semiconductor substrate, including a protruding tap extending therefrom, and a first trench in said semiconductor substrate which surrounds said DRAM cell active region including said protruding tap;

filling said first trench with insulating material;

forming a second trench in said insulating material, such that said second trench exposes said tap; and filling said second trench with conductive material to thereby form a bit line which electrically contacts said tap.

6. A method according to claim 5 wherein said step of filling said second trench is followed by the step of forming insulating material on said bit line.

7. A method according to claim 5 wherein said step of filling said first trench comprises the steps of:

blanket depositing insulating material on said semiconductor substrate including said first trench; and removing said insulating material from said semiconductor substrate outside said first trench.

8. A method according to claim 7 wherein said removing step comprises the step of chemical mechanical polishing said semiconductor substrate.

9. A method according to claim 5 wherein said step of filling said second trench comprises the steps of:

blanket depositing conductive material on said semiconductor substrate including said second trench; and removing said conductive material from said semiconductor substrate outside said second trench.

10. A method according to claim 5 wherein said step of filling said second trench comprises the step of filling said second trench with conductive material selected from the group consisting of polysilicon, metal, silicide and polycide.

11. A method according to claim 5 wherein the following step is performed between said steps of forming a second trench and filling said second trench:

implanting ions into said tap through the exposed portion of said second trench.

12. A method according to claim 6 wherein said step of forming insulating material on said bit line comprises the steps of:

blanket depositing insulating material on said semiconductor substrate including said bit line; and removing said insulating material from said semiconductor substrate outside said bit line.

* * * * *